(12) United States Patent
Chen et al.

(10) Patent No.: US 11,899,504 B2
(45) Date of Patent: *Feb. 13, 2024

(54) ELECTRONIC DEVICE

(71) Applicant: Acer Incorporated, New Taipei (TW)

(72) Inventors: Hung-Chi Chen, New Taipei (TW); Ming-Feng Hsieh, New Taipei (TW); Ju-Hsien Weng, New Taipei (TW); Tzu-Hsiang Chang, New Taipei (TW); Zheng-Yan Lee, New Taipei (TW); Yu-Ming Lin, New Taipei (TW); Huei-Ting Chuang, New Taipei (TW); Shun-Bin Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/170,914

(22) Filed: Feb. 9, 2021

(65) Prior Publication Data

US 2021/0165463 A1   Jun. 3, 2021

Related U.S. Application Data

(63) Continuation of application No. 16/427,268, filed on May 30, 2019, now Pat. No. 10,963,017.

(30) Foreign Application Priority Data

May 31, 2018   (TW) .................................. 107118663

(51) Int. Cl.
*G06F 1/16* (2006.01)
*H05K 5/02* (2006.01)

(52) U.S. Cl.
CPC .......... *G06F 1/1679* (2013.01); *G06F 1/1656* (2013.01); *H05K 5/0243* (2013.01)

(58) Field of Classification Search
CPC .... G06F 1/1679; G06F 1/1656; H05K 5/0243
See application file for complete search history.

(56) References Cited

U.S. PATENT DOCUMENTS

| 7,775,567 | B2* | 8/2010 | Ligtenberg | ............ G06F 1/1613 |
| | | | | 292/DIG. 37 |
| 8,273,986 | B2* | 9/2012 | Liu | .......................... B44C 3/10 |
| | | | | 455/575.8 |

(Continued)

FOREIGN PATENT DOCUMENTS

| CN | 2049201 | 12/1989 |
| CN | 101588522 | 11/2009 |

(Continued)

*Primary Examiner* — Abhishek M Rathod
*Assistant Examiner* — Keith DePew
(74) *Attorney, Agent, or Firm* — JCIPRNET

(57) ABSTRACT

An electronic device includes a casing, a driven component, a magnetic component and an electromagnetic component. The casing has an outer surface, an inner surface, and an accommodating groove penetrating through the outer surface and the inner surface. The driven component is movably disposed in the accommodating groove. The magnetic component is connected to the driven component. The electromagnetic component is aligned with the magnetic component, and the magnetic component and the electromagnetic component are located at the same side of the inner surface. When the electromagnetic component isn't powered, the magnetic component and the electromagnetic component are attracted to each other, and the driven component is positioned at a first position. When the electromagnetic component is powered, the magnetic component and the electromagnetic component are repulsed to each other so as to drive the driven component to move from the first position to the second position.

12 Claims, 6 Drawing Sheets

(56) References Cited

U.S. PATENT DOCUMENTS

| | | | |
|---|---|---|---|
| 9,753,490 B2 * | 9/2017 | Hill | G06F 1/1613 |
| 2006/0006674 A1 * | 1/2006 | Kang | G06F 1/1616 |
| | | | 292/251.5 |
| 2007/0138806 A1 * | 6/2007 | Ligtenberg | G06F 1/1613 |
| | | | 292/251.5 |
| 2016/0066454 A1 * | 3/2016 | Hill | H04M 1/0202 |
| | | | 156/60 |
| 2017/0355507 A1 * | 12/2017 | Rivellini | H01F 7/064 |
| 2018/0335602 A1 * | 11/2018 | Hu | G02B 7/04 |

FOREIGN PATENT DOCUMENTS

| | | | | |
|---|---|---|---|---|
| CN | 101901626 | | 12/2010 | |
| CN | 101989393 | | 3/2011 | |
| CN | 207011146 | | 2/2018 | |
| CN | 207150802 | | 3/2018 | |
| CN | 207408653 | | 5/2018 | |
| CN | 108234700 A | * | 6/2018 | |
| CN | 108248527 | | 7/2018 | |
| CN | 207802036 U | * | 8/2018 | |
| CN | 110071988 A | * | 7/2019 | ............ H04M 1/026 |
| CN | 111124038 A | * | 5/2020 | |
| JP | H09187915 | | 7/1997 | |
| TW | 201126557 | | 8/2011 | |
| WO | 2014013974 | | 1/2014 | |
| WO | WO-2019242480 A1 | * | 12/2019 | .......... H04M 1/0264 |

* cited by examiner

ELECTRONIC DEVICE

CROSS-REFERENCE TO RELATED APPLICATION

This application is a continuation application of U.S. application Ser. No. 16/427,268, filed on May 30, 2019, which claims the benefit of Taiwan application serial no. 107118663, filed on May 31, 2018. The entirety of each of the above-mentioned patent applications is hereby incorporated by reference herein and made a part of this specification.

BACKGROUND

Technical Field

The disclosure is related to an electronic device, and particularly to an electronic device having a special design.

Description of Related Art

Current electronic products such as notebook computer, table PC or smart phone are rapidly developed with new styles. Not only the specification of software and hardware are improved, but also the appearance design of product has received more attention. Therefore, related manufacturers are making more efforts to change the appearance of product in order to bring new visual experiences to users or consumers.

SUMMARY

The disclosure provides an electronic device having a special design.

The electronic device of the disclosure includes a casing, a driven component, a magnetic component and an electromagnetic component. The casing has an outer surface, an inner surface opposite to the outer surface and an accommodating groove penetrating through the outer surface and the inner surface. The driven component is movably disposed in the accommodating groove. The magnetic component is connected to the driven component. The electromagnetic component is aligned with the magnetic component, and the magnetic component and the electromagnetic component are disposed on the same side of the inner surface. When the electromagnetic component is not powered, the magnetic component and the electromagnetic component are attracted to each other, and the driven component is positioned at a first position. When the electromagnetic component is powered, the magnetic component and the electromagnetic component are repulsed to each other, thereby driving the driven component to move from the first position to a second position.

According to the disclosure, the electronic device includes a first body and a second body pivoted to each other. The second body includes a casing, a driven component, a magnetic component and an electromagnetic component. The casing has an outer surface, an inner surface opposite to the outer surface and an accommodating groove penetrating through the outer surface and the inner surface. The driven component is movably disposed in the accommodating groove. The magnetic component is connected to the driven component. The electromagnetic component is aligned with the magnetic component, and the magnetic component and the electromagnetic component are disposed on the same side of the inner surface. When the second body is closed on the first body, the electromagnetic component is not powered, the magnetic component and the electromagnetic component are attracted to each other, and the driving component is positioned at a first position. When the second body is opened relative to the first body, the electromagnetic component is powered, the magnetic component and the electromagnetic component are repulsed to each other, thereby driving the driven component to move from the first position to a second position.

Based on the above, the electronic device of the disclosure can change the position of the driven component through attractive force or repulsive force, wherein the appearance surface of the driven component exposed outside the casing (or referred to as exposed outside the accommodating groove) may have a logo, a symbol or text to bring a different visual experience to the user or have an appearance design that makes the product stand out.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention.

DESCRIPTION OF DISCLOSED EMBODIMENTS

Figure 1:
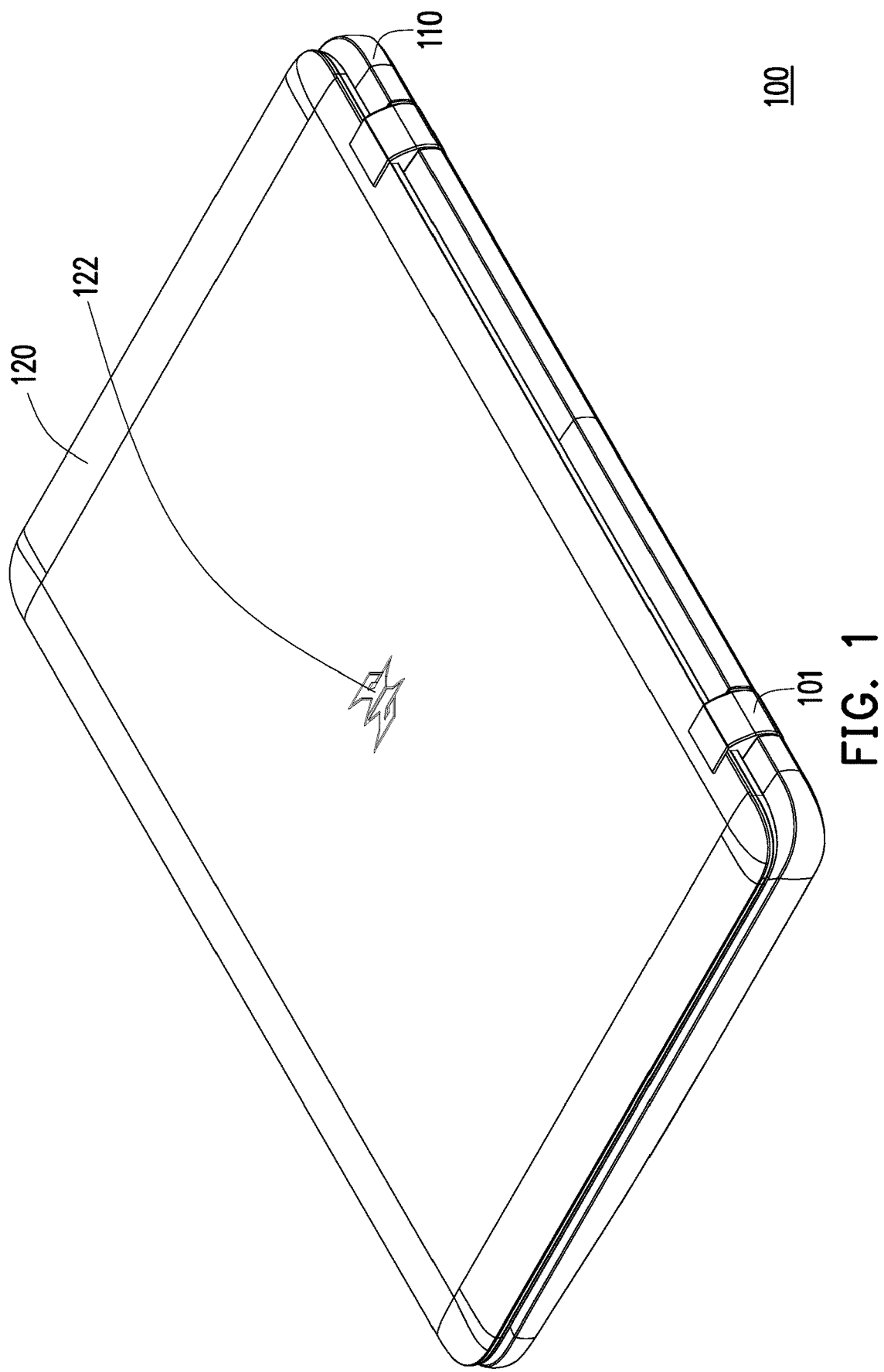
FIG. 1 is a schematic view of an electronic device according to an embodiment of the disclosure.
Figure 2:
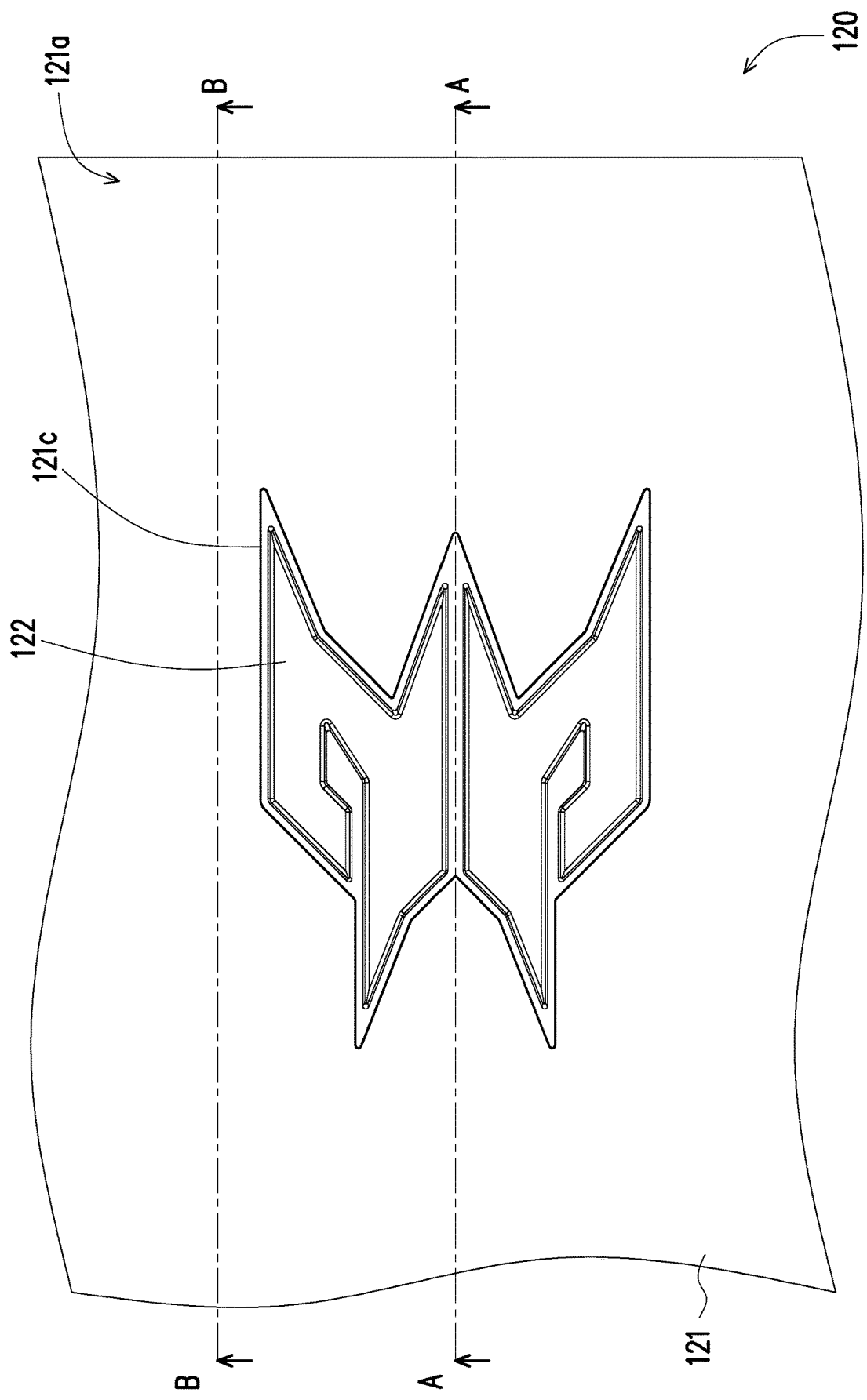
FIG. 2 is a partial schematic top view of a second body of FIG. 1.
Figure 3:
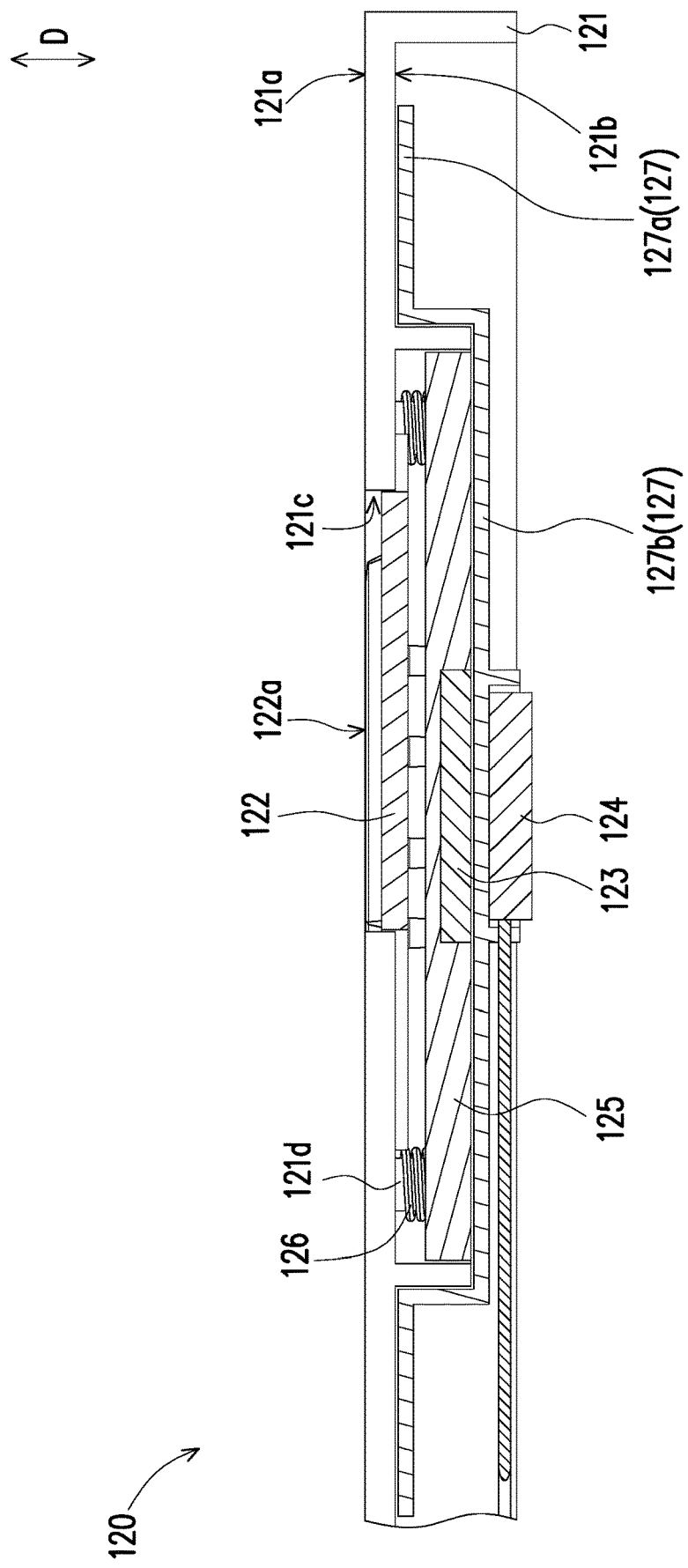
FIG. 3 is a partial schematic cross-sectional view of the second body in FIG. 2 taken along line A-A.
Figure 4:
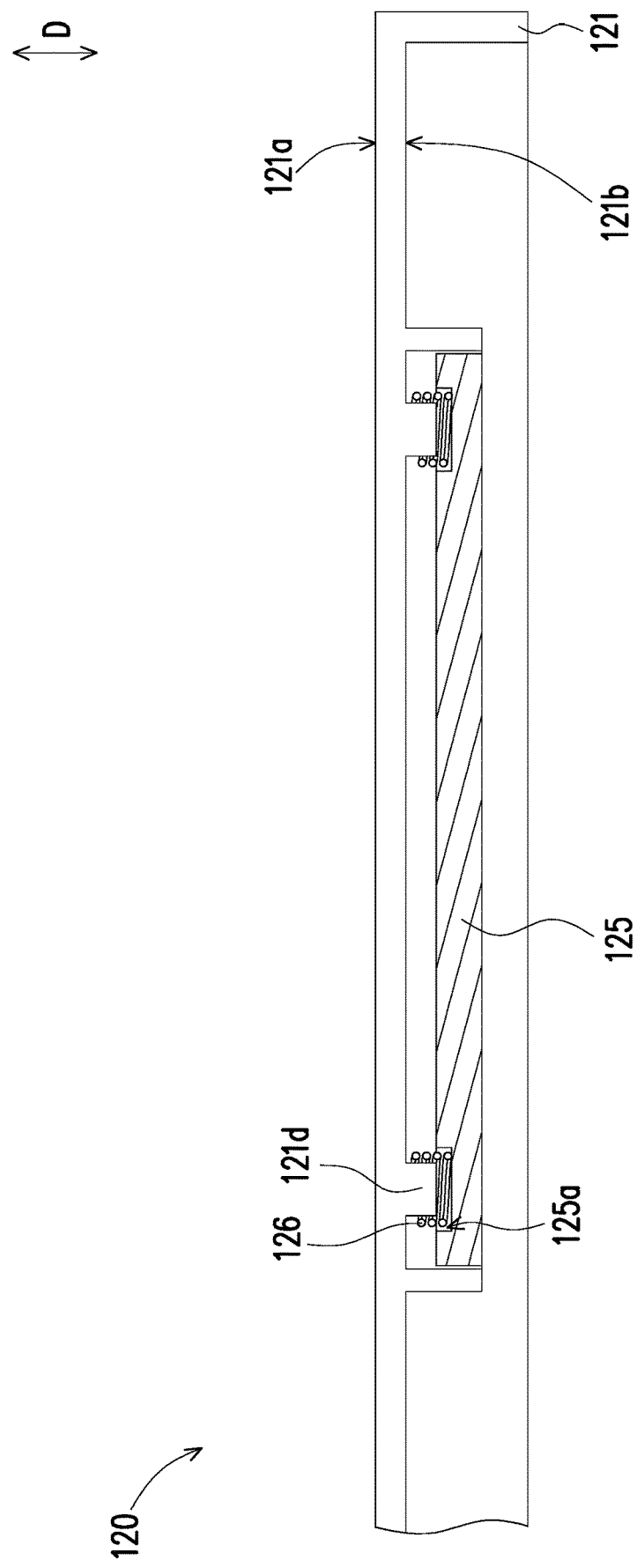
FIG. 4 is a partial schematic cross-sectional view of the second body in FIG. 2 taken along line B-B.

FIG. 1 is a schematic view of an electronic device according to an embodiment of the disclosure. FIG. 2 is a partial schematic top view of a second body of FIG. 1. FIG. 3 is a partial schematic cross-sectional view of the second body in FIG. 2 taken along line A-A. FIG. 4 is a partial schematic cross-sectional view of the second body in FIG. 2 taken along line B-B. Referring to FIG. 1 to FIG. 4, in the embodiment, an electronic device 100 may be a notebook computer, or a combination of a tablet PC and a docking station, and the electronic device 100 includes a first body 110 and a second body 120 pivoted to each other.

The second body 120 includes a casing 121, a driven component 122, a magnetic component 123 and an electromagnetic component 124, wherein the driven component 122, the magnetic component 123 and the electromagnetic component 124 are disposed in the casing 121, and a portion of the driven component 122 is exposed outside the casing 121. Furthermore, the casing 121 has an outer surface 121a, an inner surface 121b and an accommodating groove 121c, wherein the outer surface 121a and the inner surface 121b are opposite to each other, and the accommodating groove 121c penetrates through the outer surface 121a and the inner surface 121b. The driven component 122 is disposed in the accommodating groove 121c, and is moveable reciprocately relative to the casing 121 along a direction D perpendicular to the outer surface 121a of the casing 121. The appearance surface of the driven component 122 exposed outside the casing 121 (or referred to as exposed outside the accommodating groove 121c) may have a logo, a symbol or text to bring a different visual experience to the user or have an appearance design that makes the product stand out. On the other hand, the outer contour of the driven component 122 and the inner contour of the accommodating groove 121c are complementary to each other, and a cross-sectional area of the driven component 122 parallel with the outer surface 121a of the casing 121 is slightly smaller than a cross-sectional area of the accommodating groove 121c parallel with the outer surface 121a of the casing 121.

In the embodiment, the magnetic component 123 is connected to another side of the driven component 122 facing away from the appearance surface 122a, wherein the electromagnetic component 124 is aligned with the magnetic component 123, and magnetic component 123 and the electromagnetic component 124 are located on the same side of the inner surface 121b of the casing 121. Specifically, the electromagnetic component 124 may be completely or partially overlapped with the magnetic component 123 in the direction perpendicular to the outer surface 121a of the casing 121. In the condition where the electromagnetic component 124 is not powered, the electromagnetic component 124 and the magnetic component 123 are attracted to each other, with the attractive force between the electromagnetic component 124 and the magnetic component 123, the driven component 122 can be positioned at a first position shown in FIG. 3. At this time, the appearance surface 122a of the driven component 122 is, for example, slightly lower than the outer surface 121a of the casing 121, or coplanar with the outer surface 121a of the casing 121.

Figure 5:
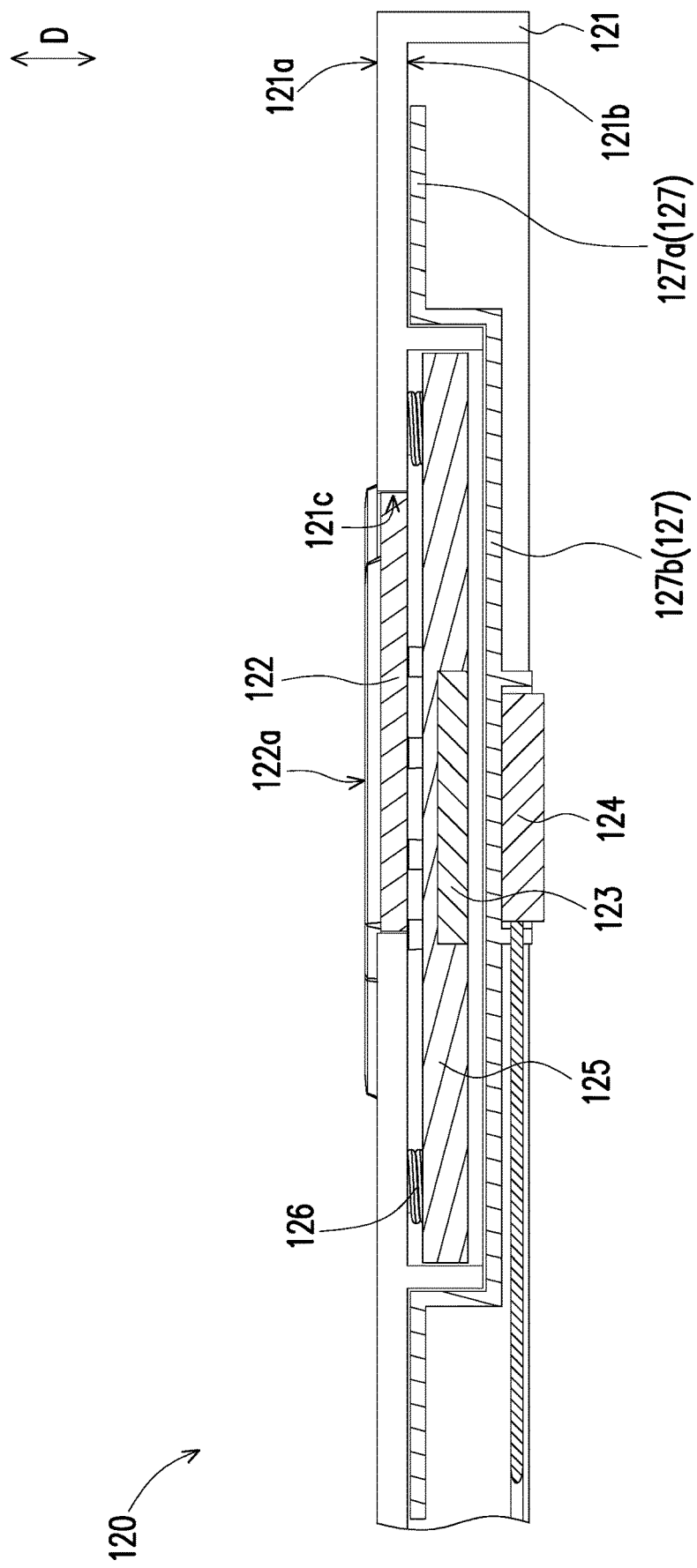
FIG. 5 is a partial schematic cross-sectional view of an electromagnetic component being powered in FIG. 3.
Figure 6:
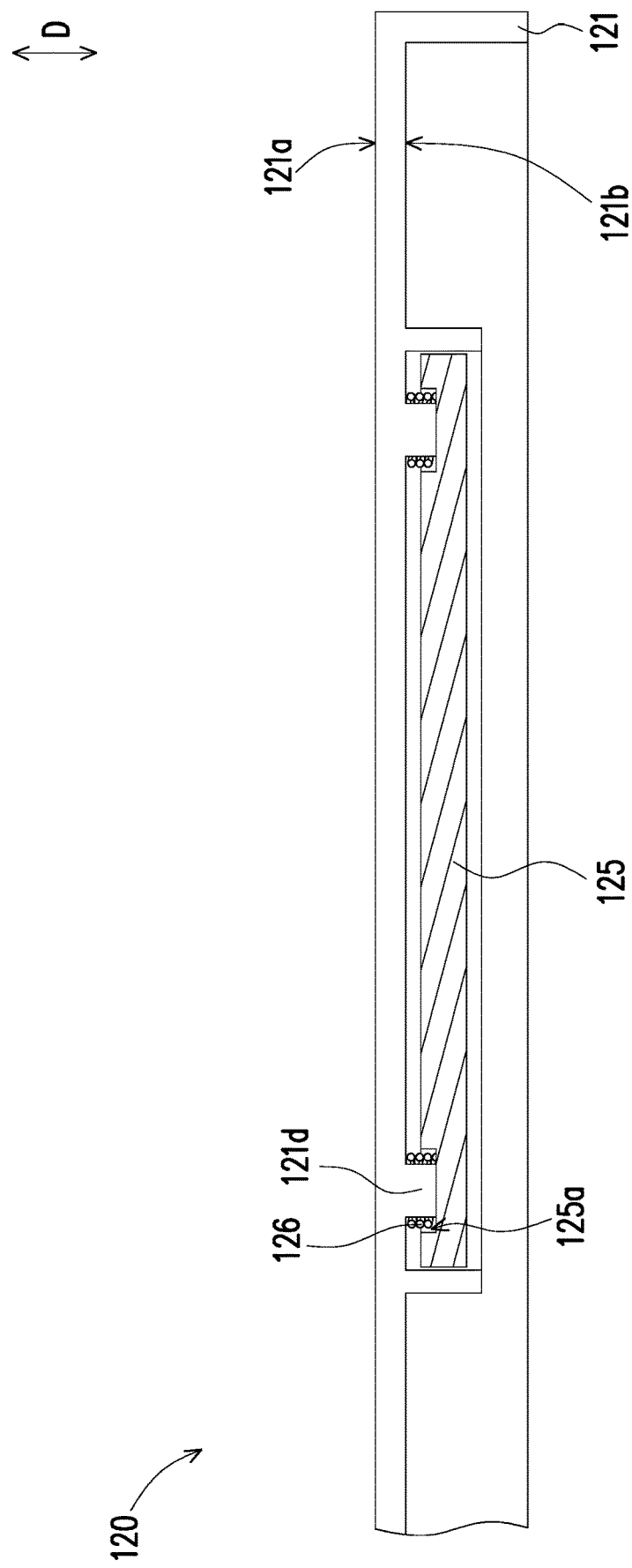
FIG. 6 is a partial schematic cross-sectional view of the electromagnetic component being powered in FIG. 4.

FIG. 5 is a partial schematic cross-sectional view of an electromagnetic component being powered in FIG. 3. FIG. 6 is a partial schematic cross-sectional view of the electromagnetic component being powered in FIG. 4. Referring to FIG. 1 and FIG. 2 to FIG. 6, take a notebook computer or a combination of tablet PC and docking station as an example, when the second body 120 is closed on the first body 110, a controller (not shown) does not control a power module (not shown) to supply current to the electromagnetic component 124. When the second body 120 is opened relative to the first body 110, the controller (not shown) receives a triggering signal, thereby controlling the power module (not shown) to supply current to the electromagnetic component 124. In the condition where the electromagnetic component 124 is powered, the electromagnetic component 124 and the magnetic component 123 are repulsed to each other, with the repulsive force between the electromagnetic component 124 and the magnetic component 123, the driven component 122 is driven to move from the first position shown in FIG. 3 to a second position shown in FIG. 5 along the direction D. After the driven component 122 is moved to the second position as shown in FIG. 5, the appearance surface 122a of the driven component 122 exceeds the outer surface 121a of the casing 121 such that the partial appearance of the product creates a stereoscopic impression.

In the embodiment, the electronic device 100 may sense a state switch between the first body 110 and the second body 120 through a gravity sensor (not shown) disposed on the second body 120, cooperation between a hall sensor (not shown) disposed on one of the first body 110 and the second body 120 and a magnet (not shown) disposed on the other one of the first body 110 and the second body 120, an angle sensor (not shown) disposed on a hinge 101 pivoted to the first body 110 and the second body 120, cooperation between a magnetic reed switch (not shown) disposed on one of the first body 110 and the second body 120 and a magnet (not shown) disposed on the other one of the first body 110 and the second body 120 or an embedded software, for example, to sense the opening action of the second body 120 relative to the first body 110 and transmit a triggering signal to the controller (not shown), thereby controlling the power module (not shown) to supply current to the electromagnetic component 124. On the contrary, if the second body 120 is closed on the first body 110, the power module stops supplying the current to the electromagnetic component 124.

Referring to FIG. 1 and FIG. 2 to FIG. 6, the second body 120 further includes a carrier 125 disposed corresponding to the accommodating groove 121c and connected to another side of the driven component 122 facing away from the appearance surface 122a. The carrier 125, the magnetic component 123 and the electromagnetic component 124 are disposed in the casing 121 and located on the same side of the inner surface 121b of the casing 121. In the embodiment, the magnetic component 123 is not directly connected to the driven component 122 but connected to the driven component 122 through the carrier 125. The carrier 125 is configured to carry the driven component 122, and the cross-sectional area of the carrier 125 parallel with the outer surface 121a of the casing 121 is larger than the cross-sectional area of the accommodating groove 121c parallel with the outer surface 121a of the casing 121; with such design, it can be prevented that the driven component 122 falls out of the casing 121.

On the other hand, the second body 120 further includes at least one elastic component 126 disposed between the carrier 125 and the inner surface 121b of the casing 121. The elastic component 126 is, for example, a compressed spring. When the electromagnetic component 124 is powered, the magnetic component 123 and the electromagnetic component 124 are repulsed to each other, with the repulsive force between the electromagnetic component 124 and the magnetic component 123, the driven component 122 can be driven to move from the first position shown in FIG. 3 to the second position shown in FIG. 5, and the carrier 125 is moved toward the inner surface 121b of the casing 121 along with the driven component 122 and compresses the elastic component 126. On the contrary, if the electromagnetic component 124 is not powered, the repulsive force between the electromagnetic component 124 and the magnetic component 123 is removed. At this time, the elastic restoring force of the elastic component 126 may drive the carrier 125 to move in a direction away from the inner surface 121b of the casing 121, and the driven component 122 is moved along with the carrier 125 to return to the first position shown in FIG. 3.

In the embodiment, the casing 121 further has at least one first positioning portion 121d located on the inner surface 121b, and the carrier 125 has at least one second positioning portion 125a facing the inner surface 121b. The first positioning portion 121d is aligned with the second positioning portion 125a, wherein the first positioning portion 121d and the second positioning portion 125a may be a combination of a pillar and a recess, and are respectively configured to position the elastic component 126. For example, the pillar may pass through the elastic component 126, and a portion of the elastic component 126 may be disposed in the recess.

On the other hand, the second body 120 further includes a bracket 127 which has at least one fixing portion 127a and a cantilever portion 127b connected to the fixing portion 127a, wherein the fixing portion 127a is connected to the inner surface 121b of the casing 121, and the elastic component 126 and the cantilever portion 127b are respectively located at two opposite sides of the carrier 125. The cantilever portion 127b is, for example, across one side of the carrier 125, wherein the electromagnetic component 124 is connected to the cantilever portion 127b, and the magnetic component 123 and the electromagnetic component 124 are respectively located at two opposite sides of the cantilever portion 127b. Specifically, the bracket 127 is configured to carry the electromagnetic component 124 and capable of limiting movement of the carrier 125 from moving in the direction away from the inner surface 121b of the casing 121.

In summary of the above, the electronic device of the disclosure can change the position of the driven component through attractive force or repulsive force, wherein the appearance surface of the driven component exposed outside the casing (or referred to as exposed outside the accommodating groove) may have a logo, a symbol or text to bring a different visual experience to the user or have an appearance design that makes the product stand out. Specifically, in the condition where the electromagnetic component is powered, the electromagnetic component and the magnetic component are repulsed to each other, with the repulsive force between the electromagnetic component and magnetic component, the driven component can be driven to move from the first position to the second position. After the driven component is moved to the second position, the appearance surface of the driven component exceeds the outer surface of the casing such that the partial appearance of the product creates a stereoscopic impression.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An electronic device, comprising:
   a casing, having an outer surface, an inner surface opposite to the outer surface and an accommodating groove penetrating through the outer surface and the inner surface;
   a driven component, movably disposed in the accommodating groove;
   a magnetic component, connected to the driven component; and
   an electromagnetic component, aligned with the magnetic component, and the magnetic component and the electromagnetic component located on the same side of the inner surface, wherein when the electromagnetic component is not powered, the magnetic component and the electromagnetic component are attracted to each other, and the driven component is positioned at a first position, when the electromagnetic component is powered, the magnetic component and the electromagnetic component are repulsed to each other, thereby driving the driven component to move from the first position to a second position,
   wherein the magnetic component and the driven component are moved synchronously along a direction perpendicular to the outer surface of the casing, and the electromagnetic component is completely or partially overlapped with the magnetic component when viewed in the direction.

2. The electronic device according to claim 1, further comprising:
   a carrier, connected to the driven component, wherein the carrier, the magnetic component and the electromagnetic component are located on the same side of the inner surface, and the magnetic component is connected to the driven component through the carrier; and
   at least one elastic component, disposed between the carrier and the inner surface, wherein when the electromagnetic component is powered, the magnetic component and the electromagnetic component are repulsed to each other, thereby driving the driven component to move from the first position to the second position, and the carrier is moved toward the inner surface along with the driven component and compresses the elastic component.

3. The electronic device according to claim 2, further comprising:
   a bracket, having at least one fixing portion and a cantilever portion connected to the fixing portion, wherein the fixing portion is connected to the inner surface, and the elastic component and the cantilever portion are respectively located at two opposite sides of the carrier, the electromagnetic component is connected to the cantilever portion, and the magnetic component and the electromagnetic component are respectively located at two opposite sides of the cantilever portion.

4. The electronic device according to claim 2, wherein the casing further has at least one first positioning portion located on the inner surface, and the carrier has at least one second positioning portion facing the inner surface, the first positioning portion is aligned with the second positioning portion and respectively configured to position the elastic component.

5. The electronic device according to claim 1, wherein the driven component has an appearance surface exposed outside the accommodating groove, when the driven component is positioned at the first position, the appearance surface is lower than or coplanar with an outer surface of the casing, after the driven component is moved from the first position to the second position, the appearance surface exceeds an outer surface of the casing.

6. The electronic device according to claim 1, further comprising:
   a carrier, connected to the driven component, wherein the carrier, the magnetic component and the electromagnetic component are located on the same side of the inner surface, and the magnetic component is connected to the driven component through the carrier; and
   a bracket, fixed to the inner surface, wherein the electromagnetic component is attached to the bracket, and the carrier is disposed between the inner surface and the bracket.

7. An electronic device, comprising:
   a first body; and
   a second body, pivoted to the first body, wherein the second body comprises: a casing, having an outer surface, an inner surface relative to the outer surface and an accommodating groove penetrating through the outer surface and the inner surface;
   a driven component, movably disposed in the accommodating groove;
   a magnetic component, connected to the driving component; and an electromagnetic component, aligned with the magnetic component, and the magnetic component and the electromagnetic component located on the same side of the inner surface, when the second body is closed on the first body, the electromagnetic component is not powered, the magnetic component and the electromagnetic component are attracted to each other, and the driven component is positioned at a first position, when the second body is opened relative to the first body, the electromagnetic component is powered, the magnetic component and the electromagnetic component are repulsed to each other, thereby driving the driven component to move from the first position to a second position, wherein the magnetic component and the driven component are moved synchronously along a direction perpendicular to the outer surface of the casing, and the electromagnetic component is completely or partially overlapped with the magnetic component when viewed in the direction.

8. The electronic device according to claim 7, wherein the second body further comprises:

a carrier, connected to the driven component, wherein the carrier, the magnetic component and the electromagnetic component are located on the same side of the inner surface, and the magnetic component is connected to the driven component through the carrier; and at least one elastic component, disposed between the carrier and the inner surface, wherein when the electromagnetic component is powered, the magnetic component and the electromagnetic component are repulsed to each other, thereby driving the driven component to move from the first position to the second position, and the carrier is moved toward the inner surface along with the driven component and compresses the elastic component.

9. The electronic device according to claim 8, wherein the second body further comprises:

a bracket, having at least one fixing portion and a cantilever portion connected to the fixing portion, wherein the fixing portion is connected to the inner surface, and the elastic component and the cantilever portion are respectively located at two opposite sides of the carrier, the electromagnetic component is connected to the cantilever portion, and the magnetic component and the electromagnetic component are respectively located at two opposite sides of the cantilever portion.

10. The electronic device according to claim 8, wherein the casing further has at least one first positioning portion located on the inner surface, and the carrier has at least one second positioning portion facing the inner surface, the first positioning portion is aligned with the second positioning portion and respectively disposed to position the elastic component.

11. The electronic device according to claim 7, wherein the driven component has an appearance surface exposed outside the accommodating groove, when the driven component is positioned at the first position, the appearance surface is lower than or coplanar with the outer surface of the casing, after the driven component is moved from the first position to the second position, the appearance surface exceeds the outer surface of the casing.

12. The electronic device according to claim 7, further comprising:

a carrier, connected to the driven component, wherein the carrier, the magnetic component and the electromagnetic component are located on the same side of the inner surface, and the magnetic component is connected to the driven component through the carrier; and a bracket, fixed to the inner surface, wherein the electromagnetic component is attached to the bracket, and the carrier is disposed between the inner surface and the bracket.

\* \* \* \* \*